United States Patent [19]

Yester, Jr.

[11] 3,760,204

[45] Sept. 18, 1973

[54] ACOUSTIC SURFACE WAVE RESONATOR

[75] Inventor: Francis R. Yester, Jr., Northlake, Ill.

[73] Assignee: Motorola, Inc., Franklin Park, Ill.

[22] Filed: Mar. 1, 1972

[21] Appl. No.: 230,813

[52] U.S. Cl. .................... 310/8.2, 310/9.5, 310/9.8, 333/72

[51] Int. Cl. .................... H01v 7/00

[58] Field of Search .................... 310/8, 8.1, 8.2, 310/9.7, 9.8; 333/72, 30 R; 73/67.8, 67.9

[56] References Cited

UNITED STATES PATENTS

| | | | |
|---|---|---|---|
| 3,523,200 | 8/1970 | Newell | 310/9.8 X |
| 3,353,120 | 11/1967 | Tournois | 333/30 R |
| 3,350,655 | 11/1967 | Fair | 333/30 R |
| 3,464,033 | 8/1969 | Tournois | 333/30 R |
| 3,435,381 | 3/1969 | Tournois | 333/30 R |

OTHER PUBLICATIONS

Surface Elastic Waves, by R. M. White, Proceedings of IEEE, Vol. 58, No. 8, Aug. 1970, pp. 1238–1242, 1246–1251, 1254, 1255, 1269, 1270, 1272, 1274, 1275

*Primary Examiner*—J. D. Miller
*Assistant Examiner*—Mark O. Budd
*Attorney*—Vincent J. Rauner et al.

[57] ABSTRACT

A piezoelectric resonator including body of piezoelectric material capable of propagating acoustic surface waves in response to electrical signals applied thereto. The surface waves are confined to a predetermined area on the surface of the piezoelectric material by bonding to the piezoelectric material a layer of acoustically transmissive material having an acoustic transmission velocity lower than the acoustic transmission velocity of the piezoelectric material. The dimension of the resultant laminate along the direction of propagation of the acoustic surface waves determines the resonant frequency of the laminate. The electrical characteristics of the resonant laminate are similar to those of quartz crystals commonly used in oscillators and filters.

15 Claims, 2 Drawing Figures

ACOUSTIC SURFACE WAVE RESONATOR

BACKGROUND

This invention relates generally to peizoelectric resonators, and more particularly to acoustic surface wave resonators.

There are many applications wherein it is necesary to provide a narrow band frequency selective network. one such application for such a frequency determining network is in radio frequency oscillators used as reference oscillators or as local oscillators in radio systems. Another application is in frequency selective networks of radio receivers.

Several techniques for providing narrow band frequency selective networks are known. One such system comprises a multiplicity of capacitors and inductors to provide a narrow band resonant circuit. Other systems use bulk wave quartz or ceramic resonators.

Whereas these techniques provide a way to achieve a narrow band frequency selective network, the first technique requires a large number of components and lacks the temperature stability required for many applications. The second technique employing bulk wave resonators requires that the resonators be precisely ground individually, thereby making it difficult to mass produce largre quantities of circuits at low cost.

SUMMARY

It is an object of the present invention to provide an improved narrow band frequency selective element.

It is a further object of this invention to provide a narrow band acoustic surface wave resonator.

It is another object of this invention to provide a frequency selective network that can be mass produced using semiconductor technology.

It is yet another object of this invention to provide an acoustic resonator having its component parts and connections thereto on a single surface.

A still further object of the invention is to provide a miniature tuned circuit for use in hybrid integrated circuits.

Still another object of the invention is to provide a means for simulataneously manufacturing resonators having different resonant frequencies.

In accordance with a preferred embodiment of the invention, a transducer comprising two sets of metallic fingers is deposited on a piezoelectric substrate. A layer of acoustically transmissive material, such as amorphous silicon dioxide, having a lower acoustic wave propagation velocity than the piezoelectric material is deposited over the fingers of the transducers and over a predetermined portion of the piezoelectric substrate. The transducer is designed to excite Love waves on the surface of the piezoelectric material. Love waves have the property that they can only exist under a layer of material having a lower propagation velocity than that of the peizoelectric material. Hence, the Love waves are confined to the area under the deposited silicon dioxide layer. The physical dimension, in the direction of surface wave propagation, of the deposited silicon dioxide layer determines the resonant frequency of the structure.

The electrical characteristics of the surface wave resonator are similar to those of a bulk wave quartz or ceramic resonator, and the surface wave resonator may be used in applications that presently require the use of a bulk wave resonator or other narrow band frequency selective elements.

DETAILED DESCRIPTION

Figure 1:
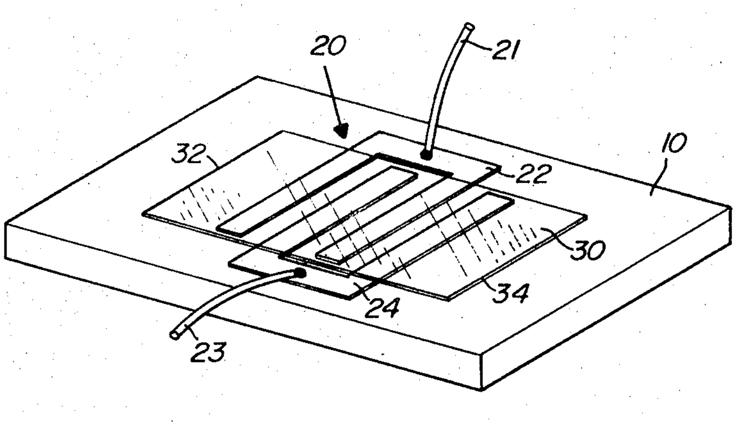
FIG. 1 is a diagram of the narrow band surface wave resonator according to the invention.

Referring now to the drawings in greater detail, FIG. 1 shows a preferred embodiment of the narrow band surface wave resonator according to the invention. Whereas FIG. 1 shows a preferred embodiment of the invention, other physical geometries and materials may be used and still fall within the scope of the invention. Substrate 10 is a layer of piezoelectric material, such as quartz, ceramic, aluminum nitride, lithium niobiate or similar material, magnetostrictive material, or other stress elements. A transducer, generally designated as transducer 20, comprising a pair of electrically conductive interdigitated finger sets 22 and 24 is deposited, or otherwise fixedly positioned, on the surface of substrate 10. Two fingers are shown in each set of simplicity of illustration but any number which will provide the below described functions, may be used. Increasing the number of fingers in transducer 20 reduces the electrical impedance of the resonator, as will be explained later in this application. The deposition may be accomplished through the use of metal depositing techniques developed for the manufacture of semiconductors. The spacing between the centers of adjacent fingers of transducer 20 is approximately one half of an acoustic wavelength at the resonant operating frequency. A relatively thin layer of acoustically transmissive material 30, such as amorphous silicon dioxide, having a lower acoustic propagation velocity than that of the piezoelectric material, is deposited or otherwise fixedly positioned on the surface of piezoelectric layer 10, and over the interdigitated finger sets 22 and 24 of transducer 20. The thickness of acoustically transmissive layer 30 is generally less than two acoustic wavelengths and preferably on the order of 0.1 wavelength. The deposition of the acoustically transmissive layer 30 can also be done using semiconductor deposition techniques. The length of the lower velocity acoustic layer 30 between boundaries 32 and 34 in a direction perpendicular to the direction of elongation of the fingers of transducer 20 is chosen to be equal to an odd integral multiple of one half an acoustic wavelength at resonance plus a correction factor for correcting for boundary effects. Boundaries 32, 34 of acoustic layer 30 are parallel to the direction of elongation of the fingers of transducer 20. The length of layer 30 will hereinafter be referred to as the propagation length.

The correction factor is necessary because some energy is stored in the form of bulk vibrations in substrate 10, and affects the reflection of the Love wave from boundaries 32, 34 in a manner analogous to the way in which a reactive termination at the end of a transmission line stores energy and affects the reflection of an electromagnetic wave. The amount of energy stored in substrate 10 is determined by the thickness of the layers and by the nature of the materials employed. The correction factor is chosen to cause reflected Love waves from boundaries 32, 34 to be 180° out of phase with waves generated by transducer 20 at the resonant operating frequency of the device. The correction factor is difficult to define mathematically, and is presently best determined experimentally.

In operation, an electrical signal including alternating current components is applied to transducer finger sets 22 and 24 via leads 21 and 23, respectively. Acoustic waves of the type known as Love waves in technical literature, are launched from transducer 20 and propagate along the surface of piezoelectric material 10 in directions perpendicular to the direction of elongation of the fingers of transducer 20. One of the characteristics of a Love wave is that it can only propagate at the junction of two acoustically transmissive media having different acoustic propagation velocities. Hence, acoustic waves launched from transducer 20 can only exist at the junction of piezoelectric layer 10 and acoustically transmissive layer 30. The Love wave launched by transducer 20 travel in directions perpendicular to the fingers of transducer 20 and boundaries 32, 34 and parallel to the propagation length of acoustically transmissive layer 30. When the waves reach boundaries 32 and 34 which define the propagation length, the waves can no longer propagate along the surface of piezoelectric material 10 and are reflected back toward transducer 20. Care must be taken to assure that boundaries 32 and 34 are perpendicular to the direction of wave propagation to assure proper reflection of the Love waves from transducer 20 and to prevent conversion of the Love waves to undesirable waves, such as, for example, Rayleigh waves. The reflected waves from boundaries 32 and 34 interact with waves launched by transducer 20, thereby causing the electrical impedance between input leads 21 and 23 to vary as the frequency of the electrical input signal applied thereto is varied. When the propagation length between boundaries 32 and 34 is equal to an odd integral multiple of one half of an acoustic wavelength of the waves launched from transducer 20 plus the aforementioned correction factor, the reflected waves from boundaries 32 and 34 will be 180° out of phase with the waves launched by transducer 20. Under these conditions, the electrical impedance between leads 21 and 23 will have its minimum value, and the device will be in resonance. As the frequency of the electrical signal applied to leads 21 and 23 is moved away from the resonant frequency, the electrical impedance between points 21 and 23 will rise providing a frequency versus impedance characteristic having series and parallel resonances similar to that of the quartz crystal known in the art. The resonant frequency of the device is determined by the spacing between fingers of transducer 20 and by the propagation length between boundaries 32 and 34. The propagation length can be easily controlled in production by methods such as semiconductor manufacturing techniques, etc.

In the embodiment of the invention shown in FIG. 1, the piezoelectric material 10 is used as a substrate and transducer 20 and acoustically transmissive layer 30 are deposited thereon. In an alternate embodiment, the substrate is a layer of acoustically transmissive material, and the transducer and a relatively thin layer of piezoelectric material are deposited on the acoustically transmissive substrate to provide a laminated structure similar to that of FIG. 1, but having the individual laminations in reverse order from those of the structure of FIG. 1. In this embodiment, the piezoelectric material should have a lower propagation velocity than that of the acoustically transmissive substrate.

In the two embodiments discussed above, the layer of material deposited on the substrate over transducer 20 is relatively thin, having a thickness generally on the order of two acoustic wavelengths or less. The propagation velocity of the deposited material should be lower than the propagation velocity of the substrate material. This requirement is necessitated by the laws of surface wave propagation.

A Love wave is a surface wave that propagates along a surface between two materials having different wave propagation velocities. It is believed that, due to the laws of refraction, a Love wave cannot enter the higher propagation velocity material but is reflected by the surface of the higher velocity material. Therefore, the Love wave must propagate along the surface of the lower velocity material, thereby causing the lower velocity material to vibrate. If the lower velocity layer has an appreciable thickness, the surface vibrations can excite the layer into other vibrational modes of slightly different frequencies which can cause undesirable spurious responses in the resonator. Restricting the thickness of the lower velocity layer to make it as nearly two dimensional as possible, minimizes the various spurious vibrational modes. It should be noted, however, that in applications where spurious modes are not a consideration, the thickness of the lower velocity layer need not be controlled and the thickness of this layer can be less than, equal to or greater than the thickness of the higher velocity layer.

The electrical impedance of the resonator is determined in part by the number of fingers comprising transducer 20. This allows the resonator to be tailored to match the impedance levels of the circuit in which it is to be employed by varying the number of fingers in transducer 20. This technique may be employed to advantage to increase the equivalent parallel resistance of the resonator when the resonator is used in a parallel resonant circuit.

Figure 2:
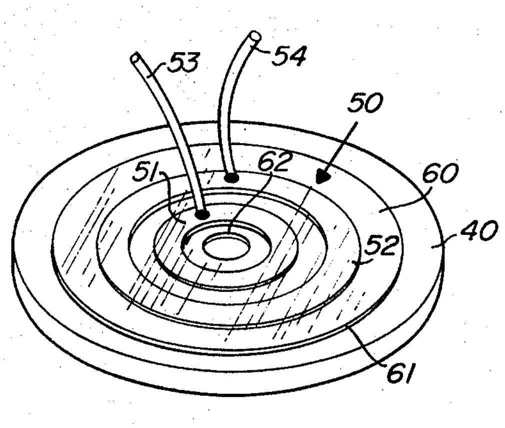
FIG. 2 is a diagram of another embodiment of the surface wave resonator according to the invention employing circular geometry.

Referring now to FIG. 2, there is shown a circular geometry embodiment of the surface wave resonator. Substrate 40 is a layer of piezoelectric material similar to the material used in substrate 10 of FIG. 1. Transducer 50 is a pair of coaxial electrically conductive rings 51 and 52 deposited or otherwise fixedly positioned on the surface of substrate 40. Two rings are shown for simplicity of illustration, but any number may be used. In this embodiment, the rings are deposited through the use of metal depositing techniques developed for manufacture of semiconductors. The spacing between the average radii of adjacent rings 51 and 52 is approximately one half of an acoustic wavelength at the resonant operating frequency. An annular layer of acoustically transmissive material 60 having a propagation velocity lower than that of the piezoelectric substrate is deposited on the surface 40 and over transducer 50 coaxially with rings 51 and 52. The spacing between a boundary 61 of layer 60 and the average radius of ring 52 is equal to the energy storage correction factor. Boundary 62 and ring 51 are similarly spaced.

In operation, an electrical signal including an alternating current component, is applied to transducer 50 via leads 53 and 54. Love type acoustic waves are launched from transducer 50 and propagate radially from transducer 50. The waves propagate radially along the interface of substrate 40 and layer 60 and impinge on annular boundaries 61 and 62 of layer 60, whereupon they are reflected from annular boundaries 61, 62 toward transducer 50. The reflected waves from boundaries 61, 62 interact with waves launched by transducer 50, causing the electrical impedance between input leads 53 and 54 to vary as the frequency of the electrical input signal applied thereto is varied. When the radial distance between annular boundaries 61, 62 is equal to an odd integral multiple of one half of an acoustic wavelength of the waves launched from transducer 50 plus the appropriate correction factor, the reflected waves from boundaries 61, 62 will be 180° out of phase with the waves launched by transducer 50, thereby lowering the electrical impedance between leads 53 and 54 to its minimum value. The electrical impedance between leads 53 and 54 will have characteristics similar to that of the impedance between leads 20 and 21 of FIG. 1. The frequency at which the electrical impedance between leads 53 and 54 reaches its minimum value is known as the resonant frequency of the structure. Thus, the resonant frequency is determined by the difference in radii of rings 51, 52 and by the radial distance between annular boundaries 61 and 62.

In the embodiment of the invention shown in FIG. 2, the piezoelectric material 40 is used as a substrate and transducer 50 and acoustically transmissive layer 60 are deposited thereon. As in the case of the geometry of FIG. 1, the order of the layers of a structure having the geometry of FIG. 2 may be reversed so that the substrate is a layer of acoustically transmissive material and the transducer and piezoelectric material are deposited thereon. Also, the number of rings comprising transducer 50 may be varied to change the electrical impedance of the resonator.

Whereas structures having particular geometries have been used to describe the invention, other resonators employing a laminated structure but having other geometries wherein the propagation length of the geometry defines the resonant frequency still fall within the scope of the invention. The structures of the embodiments described above employ piezoelectric material to excite acoustic vibrations in the resonator, but any stress element that changes its physical dimensions in response to an electrical or magnetic field applied thereto, and which produces an electric or magnetic field in response to an applied stress, may be used.

In summary, the resonator according to the invention provides a reliable, low cost and efficient means for obtaining a stable narrow band frequency selective network. The system eliminates the complexity of inductance-capacitance networks and the precision cutting required in the manufacture of bulk wave quartz and ceramic resonators. Resonators according to the invention can be mass produced at low cost using semiconductor manufacturing techniques. In addition, several resonators having the same or different resonant frequencies and different electrical impedances can be fabricated on a single substrate to provide a low cost, complex filter.

I claim:

1. An acoustic resonator having a resonant frequency and responsive to signals applied thereto including in combination, a stress element having a first acoustic wave propagation velocity, transducer means coupled to said stress element for exciting said stress element to produce acoustic surface waves that propagate in predetermined directions in response to said signals, and an acoustic element having a second acoustic wave propagation velocity acoustically coupled to said transducer means and bonded to said stress element to form a laminate having predetermined boundaries, said predetermined boundaries defining a predetermined propagation length therebetween in the direction of propagation of said surface waves, said acoustic element and said stress element cooperating to confine said acoustic surface waves within the area of the junction of said acoustic element and said stress element of said laminate, said predetermined boundaries being spaced apart a distance generally equal to an odd integral multiple and one half acoustic wavelengths at the resonant frequency and positioned perpendicular to the direction of propagation of said waves for reflecting said acoustic waves to form an acoustically resonant structure in said laminate between said boundaries, said propagation length determining the resonant frequency of said resonantor.

2. An acoustic resonator having a resonant frequency and responsive to electrical signals applied thereto including in combination, a layer of piezoelectric material having a first acoustic wave propagation velocity, and transducer means coupled to said piezoelectric material for exciting said piezoelectric material to produce acoustic surface waves that propagate in predetermined directions in response to said electrical signals, a layer of acoustic material having a second acoustic wave propagation velocity different than said first acoustic wave propagation velocity acoustically coupled to said transducer means and bonded to said piezoelectric material to form a laminate having predetermined boundaries defining a predetermined propagation length in the direction of propagation of said waves therebetween, said layer of piezoelectric material and said layer of acoustic material cooperating to confine said acoustic surface waves within the area of the junction of said layer of piezoelectric material and said acoustic layer of said laminate, said boundaries being spaced apart a distance generally equal to an odd integral multiple of one half acoustic wavelengths at the resonant frequency and positioned perpendicular to said direction of propagation for reflecting said acoustic waves to form an acoustically resonant structure between said boundaries, said propagation length between said boundaries determining the resonant frequency of said resonator.

3. An acoustic resonator according to claim 16, wherein said transducer includes a plurality of parallel interdigitated fingers, and wherein said boundaries are parallel to said fingers.

4. An acoustic resonator according to claim 2 wherein said layer of said piezoelectric material is a substrate and said layer of said acoustic material is deposited thereon, said deposited layer and said substrate each having a predetermined length in the direction of wave propagation, said length in the direction of propagation of said deposited layer being smaller than said length in the direction of propagation of said substrate and determining said propagation length of said laminate.

5. An acoustic resonator according to claim 4 wherein said acoustic material is amorphous silicon dioxide and said piezoelectric material is quartz.

6. An acoustic resonator according to claim 4 wherein said acoustic material is amorphous silicon dioxide and said piezoelectric material is aluminum nitride.

7. An acoustic resonator according to claim 4 wherein said transducer means is deposited on said substrate of piezoelectric material, and said layer of acoustic material is deposited over said transducer means.

8. An acoustic resonator according to claim 4 wherein said deposited layer has a thickness of less than two acoustic wavelengths.

9. An acoustic resonator according to claim 8 wherein said first acoustic wave propagation velocity is greater than said second acoustic wave propagation velocity.

10. An acoustic resonator according to claim 2 wherein said layer of said acoustic material is a substrate and said layer of said piezoelectric material is deposited thereon, said substrate and said deposited layer each having a predetermined length in the direction of wave propagation, said length in the direction of wave propagation of said deposited layer being smaller than said length in the direction of wave propagation of said substrate and determining said propagation length of said laminate.

11. An acoustic resonator according to claim 10 wherein said transducer means are deposited on said substrate of acoustic material, and said layer of piezoelectic material is deposited over said transducer means.

12. An acoustic resonator according to claim 10 wherein said deposited layer has a thickness of less than two acoustic wavelengths.

13. An acoustic resonator according to claim 12 wherein said second acoustic wave propagation velocity is greater than said first acoustic wave propagation velocity.

14. An acoustic resonator according to claim 2 wherein one of said layers is annular and wherein said propagation length of said resonator is the radial distance between the annular boundaries of said layers.

15. An acoustic resonator as recited in claim 2 wherein said transducer means is a single transducer positioned between said layers and between said boundaries for receiving the waves reflected by said boundaries, said transducer being responsive to the waves reflected by said boundaries for altering the electrical impedance to the electrical signals applied to said transducer, said electrical impedance having a minimum value at said resonant frequency.

* * * * *

UNITED STATES PATENT AND TRADEMARK OFFICE

CERTIFICATE OF CORRECTION

PATENT NO. : 3,760,204

DATED : September 18, 1973

INVENTOR(S) : Francis R. Yester, Jr.

It is certified that error appears in the above-identified patent and that said Letters Patent are hereby corrected as shown below:

Claim 3, line 1, change "16" to read --15--.

Signed and Sealed this

*sixteenth* Day of *August 1977*

[SEAL]

*Attest:*

RUTH C. MASON
*Attesting Officer*

C. MARSHALL DANN
*Commissioner of Patents and Trademarks*